United States Patent [19]

Edmond

[11] Patent Number: 4,918,497
[45] Date of Patent: Apr. 17, 1990

[54] BLUE LIGHT EMITTING DIODE FORMED IN SILICON CARBIDE

[75] Inventor: John A. Edmond, Apex, N.C.

[73] Assignee: Cree Research, Inc., Durham, N.C.

[21] Appl. No.: 284,293

[22] Filed: Dec. 14, 1988

[51] Int. Cl.$^4$ ............................................. H01L 33/00
[52] U.S. Cl. ......................................... 357/17; 357/17
[58] Field of Search ........................................... 357/17

[56] References Cited

U.S. PATENT DOCUMENTS

| | | | |
|---|---|---|---|
| 3,458,779 | 7/1969 | Blank et al. | 317/234 |
| 3,508,015 | 4/1970 | Miller et al. | 179/100.3 |
| 3,530,324 | 9/1970 | Koller | 313/108 |
| 3,535,469 | 10/1970 | Miller | 179/100.3 |
| 3,565,703 | 2/1971 | Kamath | 148/172 |
| 3,611,064 | 10/1971 | Hall et al. | 317/234 R |
| 3,649,384 | 3/1972 | Kamath | 148/171 |
| 3,715,636 | 2/1973 | Jaffe et al. | 317/234 R |
| 3,773,553 | 11/1973 | Kamath | 17/201 |
| 3,960,619 | 6/1976 | Seiter | 148/175 |
| 3,972,749 | 8/1976 | Pavlichenko | |
| 3,986,193 | 10/1976 | Vodakov et al. | 317/234 |
| 4,531,142 | 7/1985 | Weyrich et al. | 357/17 |

OTHER PUBLICATIONS

A New Degradation Phenomenon in Blue Light Emitting Silicon Carbide Diodes, G. Ziegler and D. Theis, IEEE Transactions of Electron Devices, vol. ED.-28, No. 4, Apr. 1981.
Light-Emitting Devices Based on Silicon Carbide; E.E. Violin and Yu. M. Tairov (1973).
Luminescent Devices, J. M. Blank (1973).
Single Crystal Growth of SiC Substrate Material for Blue Light Emitting Diodes, G. Ziegler, P. Lanig, D. Theis, and C. Weyrich, IEEE Transactions on Electronic Devices, vol. ED-30, No. 4, Apr. 1983.
Fabrication of 6H-SiC Light-Emitting Diodes by a Rotation Dipping Technique: Electroluminescence Mechanisms, M. Ikeda, T. Hayakawa, S. Yamagiwa, H. Matsunami, and T. Tanaka, J. Appl. Phys., 50(12), Dec. 1979.
Structure and Characteristics of Silicon Carbide Light-Emitting Junctions, Lyle Patrick, J. Appl. Phys., vol. 28, No. 7, Jul. 1957.
Solution Grown SiC p-n Junctions, R. W. Brander and R. P. Sutton, The General Electric Co. Ltd., Central Research Lab. Hirst Research Cent. Wembley, Middlesex, Brit. J. Appl. Phys. (J. Phys. D), 1969, Ser. 2, vol. 2.
Cathodoluminescence Measurements on a Silicon Carbide Light-Emitting Diode, Ralph M. Potter, Lighting Res. and Tech. Serv. Operation, General Electric Co., Nela Park, Cleveland, Ohio, J. Appl. Phys., vol. 43, No. 2, Feb. 1972.
Semiconductor Light Sources from Silicon Carbide, G. F. Kholuyanov and Yu. A. Vodakov (1973).
Photoluminescence Due to Al, Ga, and B Acceptros in 4H-, 6H-, and 3C-SiC Grown from a Si Melt, A. Suzuki, H. Matsunami, and T. Tanaka, Dept. of Elec., (List continued on next page.)

Primary Examiner—Martin H. Edlow
Assistant Examiner—Stephen D. Meier
Attorney, Agent, or Firm—Bell, Seltzer, Park & Gibson

[57] ABSTRACT

The present invention comprises a light emitting diode formed in silicon carbide and that emits visible light having a wavelength of between about 475-480 nanometers, or between about 455-460 nanometers, or between about 424-428 nanometers. The diode comprises a substrate of alpha silicon carbide having a first conductivity type and a first epitaxial layer of alpha silicon carbide upon the substrate having the same conductivity type as the substrate. A second epitaxial layer of alpha silicon carbide is upon the first epitaxial layer, has the opposite conductivity type from the first layer, and forms a p-n junction with the first epitaxial layer. In preferred embodiments, the first and second epitaxial layers have carrier concentrations sufficiently different from one another so that the amount of hole current and electron current that flow across the junction under biased conditions are different from one another and so that the majority of recombination events take place in the desired epitaxial layer.

64 Claims, 4 Drawing Sheets

OTHER PUBLICATIONS

Kyoto Uni., Kyoto 606, Japan, Mech. of GaAs Anodization, vol. 124, No. 2, Feb. 77.

SiC Blue LED's by Liquid-Phase Epitaxy, H. Matsunami, M. Ikeda, A. Suzuki and T. Tanka, IEEE Trans. of Elec. Devices, vol. Ed.-24, No. 7, Jul. 1977.

Current-Voltage and Brightness-Current Characteristics of Silicon Carbide Light-Emitting Diodes Under Prebreakdown Conditions, M. S. Saidov, Kh. A Sharmuratov, and A. Umurzakov, Sov. Phys. Semicond, 12(9), Sep. 1978.

Site Effect on the Impurity Levels in 4H, 6H, and 15R SiC, M. Ikeda, H. Matsunami, and T. Tanaka, Dept. of Elec., Faculty of Engineering, Kyoto Uni., Kyoto 606, Japan, Physical Review B, vol. 22, No. 6, Sep. 15, 1980.

V. A. Dmitriev, Silicon Carbide Light-Emitting Diodes for the Blue-Violet Region, Sov. Tech. Phys. Lett, 11(2), Feb. 1985.

L. Hoffmann, Silcon Carbide Blue Light Emitting Diodes with Improved External Quantum Efficiency, J. Appl. Phys., 53(10), Oct. 1982.

Shigehiro Nishino, Blue-Emitting Diodes of 6H-SiC Prepared by Chemical Vapor Deposition, Japanese Journal of Applied Physics, vol. 19, No. 7, Jul. 1980, pp. L353-L356.

W. V. Munch, Silicon Carbide Blue-Emitting Diodes Produced by Liquid-Phase Epitaxy, Solid-State Electronics, vol. 21, pp. 1129-1132, Pergamon Press Ltd., 1978.

W. V. Munch, Silicon Carbide Technology for Blue-Emitting Diodes, Journal of Electronic Materials, vol. 6, No. 4, 1977.

W. V. Munch, Silicon Carbide Light-Emitting Diodes with Epitaxial Junctions, Solid-State Electronics, 1976, vol. 19, pp. 871-874, Pergamon Press.

Specifications for LBD5410 Blue T1 3/4 LED Lamp, Siemens Components, Inc., Optoelectronics Division, 19000 Homestead Road, Cupertino, CA 95014.

(455-460 nm)

(424-428nm)

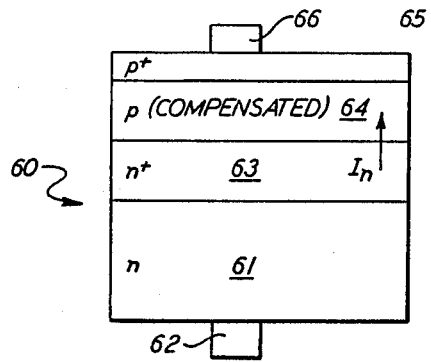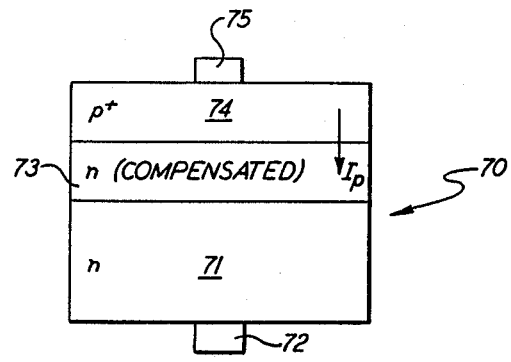
(475-480 nm)
Fig. 5.  Fig. 6.
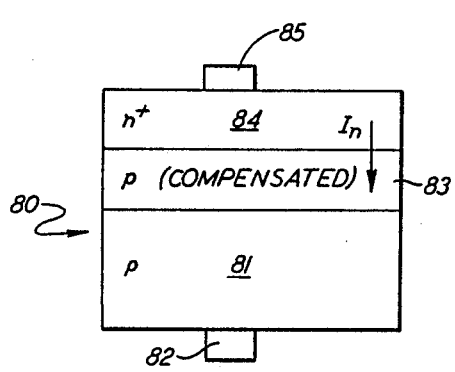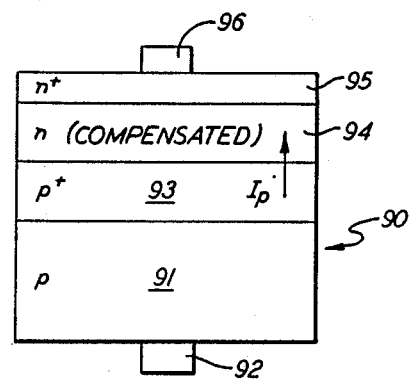
(475-480 nm)
Fig. 7.  Fig. 8.

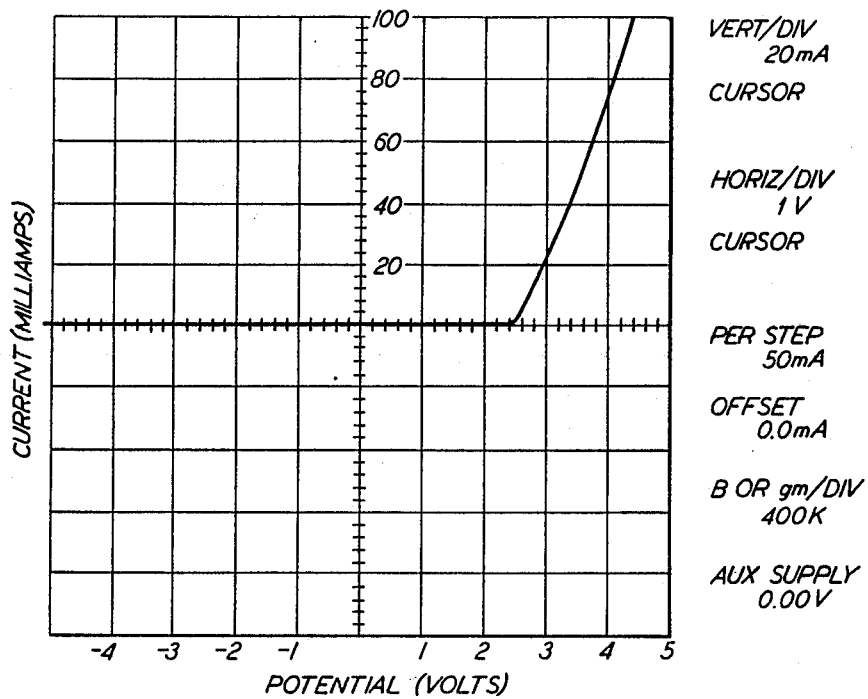
_Fig. 11._
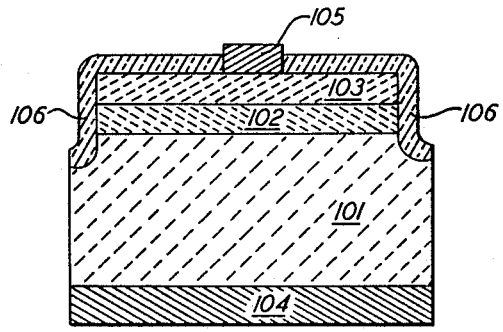
_Fig. 12._

BLUE LIGHT EMITTING DIODE FORMED IN SILICON CARBIDE

FIELD OF THE INVENTION

The present invention relates to the structure and manufacture of light emitting diodes and in particular relates to light emitting diodes formed in silicon carbide which emit blue light.

BACKGROUND OF THE INVENTION

Light emitting diodes, commonly referred to as "LED's", are semiconductor devices which convert electrical power into emitted light.

As is known to those familiar with atomic and molecular structure and the electronic transitions of electrons according to the theories and rules of quantum mechanics, when electrons make transitions between their allowed energy levels in atoms or molecules, these transitions are always accompanied by a gain or loss of specific quanta of energy. Specifically, raising electrons to higher energy levels absorbs energy and the movement of electrons from higher energy levels to lower ones generates energy. Generally, the energy given off when electrons make such "downward" transitions is in the form of vibrational energy, often observed as heat, or light energy—i.e. photons—which, if in the visible spectrum, can be detected by the human eye.

In a light emitting diode, the generation or "injection" of a current of either electrons or holes across the diode junction followed by the recombination of the injected carriers with either holes or electrons encourages such electronic transitions and is likewise accompanied by either vibrational energy or light, or both. In general, transitions in direct band gap materials generate mostly light while transitions in indirect materials generate mostly heat and some light. Direct band gap materials are defined as those in which the minimum in the conduction band corresponds to the maxima in the valence band, at the same momentum. Correspondingly, in indirect band gap materials, the respective minima and maxima do not coincide at the same momentum.

As is further known to those familiar with electronic transitions, the wavelength of the light which is generated is directly related to the size of the electronic transition. The nature of electromagnetic radiation is such that smaller electronic transitions within the visible range tend to emit longer wavelengths of light, toward the red portion of the visible spectrum, and that larger energy transitions tend to emit shorter wavelengths of light, toward the violet portion. Furthermore, such transitions are always specifically characteristic of the materials in which they occur so that the entire field of spectroscopy is based upon the premise that atoms, molecules and substances can be identified by the characteristic manner in which they react with the electromagnetic spectrum, including visible, ultraviolet and infrared light. Accordingly, the colors which any given semiconductor material can generate are limited and in particular, it has been difficult to date to successfully produce LED's which emit characteristic blue colors. Because blue is one of the primary colors, the lack of such consistently available efficient blue LED's raises problems in a number of technological fields. Absent available blue light, the colors that can be produced or imaged using LED's are limited to red and green and those colors which can be formed therefrom.

In order to produce blue light, a semiconductor material must have a band gap larger than 2.6 electron volts (eV). As is known to those familiar with semiconductor materials, the band gap represents the energy difference between the conduction band and the valance band of the particular semiconductor material. At the present time, commercially available visible light emitting diodes based on materials such as gallium phosphide (GaP) or gallium arsenide (GaAs) are not suitable for producing blue light because the band gaps are on the order of about 2.26 eV or less. Instead, a blue light emitting solid state diode must be formed from a relatively large gap semiconductor such as gallium nitride (GaN), zinc sulfide (ZnS), zinc selenide (ZnSe) and alpha silicon carbide (also characterized as "hexagonal" or "6H" silicon carbide). Accordingly, a number of investigators have attempted to produce blue light emitting diodes using alpha silicon carbide.

Silicon carbide offers a number of advantages as a potential semiconductor material for blue light emitting diodes. In particular silicon carbide can be readily doped both p and n type. In addition to its wide band gap, silicon carbide also has a high thermal conductivity, a high saturated electron drift velocity, and a high breakdown electric field. To date, however, silicon carbide has not reached the full commercial position in the manufacture of electronic devices, including light emitting diodes, that would be expected on the basis of its excellent semiconductor properties and its potential for producing blue LED's. This is generally the result of the difficulties encountered in working with silicon carbide: high process temperatures are often required, good starting materials can be difficult to obtain, certain doping techniques have heretofore been difficult to accomplish, and perhaps most importantly, silicon carbide crystallizes in over 150 polytypes, many of which are separated by very small thermodynamic differences.

Accordingly, the goal of controlling the growth of single crystals or monocrystalline thin films of silicon carbide which are of a sufficient quality to make electronic devices such as diodes practical, useful and commercially viable, has eluded researchers in spite of years of diligent effort, much of which is reflected in both the patent and nonpatent literature.

Recently, however, a number of developments have been accomplished which offer the ability to grow large single crystals of device quality silicon carbide, thin films of device quality silicon carbide, and to introduce dopants to silicon carbide, as required in the manufacture of LED's and other electronic devices. These development are the subject of co-pending patent applications which have been assigned to the common assignee of the present invention and which are incorporated herein by reference. These include Davis et al, "Growth of Beta-Sic Thin Films and Semiconductor Devices Fabricated Thereon," Ser. No. 113,921, Filed Oct. 26, 1987; Davis et al, "Homoepitaxial Growth of Alpha-Sic Thin Films and Semiconductor Devices Fabricated Thereon," Ser. No. 113,573, Filed Oct. 26, 1987; Davis et al, "Sublimation of Silicon Carbide to Produce Large, Device Quality Single Crystals of Silicon Carbide," Ser. No. 113,565, Filed Oct. 26, 1987; and Edmond et al, "Implantation and Electrical Activation of Dopants Into Monocrystalline Silicon Carbide," Ser. No. 113,561, Filed Oct. 26, 1987.

The alpha polytype of silicon carbide has a band gap of 2.9 electron volts at room temperature. This band gap is large enough so that any color in the visible spectrum should be available providing the appropriate transition can be made. Because the transition is 2.9 eV in pure silicon carbide, however, a full band gap transition produces light of 424–428 nanometers (nm) wavelength, which has a characteristic violet color. Therefore silicon carbide typically must be doped to provide an additional acceptor level in the crystal to which electrons can move from the conduction band of silicon carbide. For example, if silicon carbide is doped with aluminum, the aluminum dopant will form an acceptor level which is approximately 2.7 eV below the conduction band. As a result, electrons making the transition from the conduction band of silicon carbide to the aluminum dopant acceptor level will emit blue light of approximately 455–460 nanometers.

As set forth earlier, because light is emitted by electrons in transition between energy level, the goal in producing a light from a semiconductor device is promoting or otherwise encouraging such transitions. A diode, which reduced to its basic structure represents a p-n junction, such a method for encouraging the transitions. When holes or electrons are injected across the p-n junction, they will recombine with one another, and a number of the recombination events will include the movement of electrons from conduction or donor bands to valance or acceptor bands and emit the desired light.

Because the overall goal in producing LED's is to obtain as much emitted light as possible the underlying related goals are to be able to inject as much current as possible across the p-n junction, to have the greatest possible dopant population in the emitting layer, to have the greatest possible efficiency in producing recombination events, and to have a physical structure, including transparency, which enhances the visible light obtained from the diode.

In this regard, the flow of current in a diode can be thought of either as the flow of electrons from n to p or the flow of holes from p to n. To obtain various hues of blue emitting devices, both modes of injection are necessary. In most instances, however, it is desireable for most of the current going through the diode to be n-type current; i.e. the flow of electrons across the junction and into the p-type material. This results in a higher electron population on the p side of the junction and a resulting greater number of recombinations, transitions, and photons emitted.

Presently available blue LED's, however, tend to operate on a less favorable basis. One particular commercially available device uses the higher p current in order to attempt to get the desired number of recombinations and in particular uses a p+-n junction in which, as explained more fully hereinafter, the "+" designation represents a generally greater population of active dopant in the particular material. Such a device works predominantly on hole injection to get the recombination which results in the 480 nanometer emission.

As stated earlier, however, the full band gap in silicon carbide is approximately 2.9 eV, and a transition across this band gap will produce a violet photon rather than a blue one. The most efficient transition in silicon carbide, however, is between an impurity band of nitrogen (donor) below the conduction band and an impurity band of aluminum (acceptor) above the valence band so that electrons and holes which recombine upon injection make a transition between the doped nitrogen and doped aluminum bands and emit the 475–480 nanometer photon which has a more characteristic blue color. Therefore, the predominant carrier flow or injection—whether electrons or holes—must be made into the compensated layer, whether p or n. As a result, in order to use hole current to produce blue light, the portion of the diode which is n-type must be doped with both donor (nitrogen) and acceptor (aluminum) dopants, a technique and structure known as "compensation." Therefore, in order to have a compensated n-type material, a greater number of n-type dopant atoms must be present in the material than p-type dopant atoms.

As stated earlier, one commercially available LED uses a p+-n junction of this type to get the 480 nanometer recombination and resulting photon. Such LED's are formed by using a p-type substrate and growing a p+ layer on top by liquid phase epitaxy (LPE) with aluminum (Al) as the p-type dopant. Following the addition of the p+ layer during LPE, nitrogen gas may be bubbled into the LPE melt. With the aluminum dopants still in place, the result is a compensated n-type layer. By using this growth technique, one is essentially limited to this device configuration.

There are a number of problems and limitations, however, associated with the use of liquid phase epitaxy to form a p+-n junction. First, it requires the use of a p substrate. Generally, such a substrate has a rather high resistivity because the mobility of holes is only one-sixth of the mobility of electrons and because less than 2% of the acceptor atoms are ionized at room temperature. This results in a higher resistance in forward bias for a diode, which as known to those familiar with such devices, is a less desireable diode characteristic.

One "cure" for this problem is to increase the hole concentration in the p-type substrate. The addition of the extra dopant, however, literally makes the crystal opaque and reduces the emitted light that can be observed. Thus, the problem is a trade off between desirable high transparency and undesirable high resistivity. Adding more p-type dopant to desirably lower the resistivity correspondingly and undesirably lowers the transparency. Alternatively, maintaining a desirable transparency correspondingly and undesirably results in high resistivity.

Yet another attempt to avoid the problem is to put both contacts for the diode on the face of the diode in order to avoid using the substrate as a conductor; see, for example, U.S. Pat. No. 4,531,142. This is an extremely difficult manufacturing technique, however, as reflected in the lower availability and high cost of such diodes.

In addition to using a highly transparent substrate, the light output can be increased by increasing the current injected into the compensated layer. Here the attempt is to increase the p concentration in the p region, which requires increasing the p-type dopant in the epitaxial layer. There are, however, limitations to how high the p concentration can made. In particular, every dopant atom present does not automatically result in an ionized carrier (hole or electron) being present. Generally speaking, the amount of ionized carriers is directly proportional to the number of dopant atoms, but is inversely and exponentially proportional to the ionization (activation) energy of the dopant atom. For example, the ionization energy of aluminum is on the order of 210–220 millielectron volts (meV), while that of nitrogen is only 70–80 meV. Therefore, it is much easier to raise the concentration of ionized n-type dopant atoms than it is to raise the concentration of ionized p-type dopant atoms using nitrogen and aluminum respectively.

Those familiar with such transitions will be aware that the ionization of the materials is thermally generated; i.e. the number of dopant atoms ionized depends upon the temperature as well as the ionization energy. For example, at room temperature with a doping level of $1 \times 10^{19}$ atoms/cm$^3$, only approximately 1% of aluminum carrier atoms are ionized while approximately 22% of nitrogen carrier atoms are ionized. Therefore, for the same number of dopant atoms, the population of ionized n-type dopant ions will be many times as great as that of p-type dopant atoms. As a corresponding result, adding more p-type dopant—usually aluminum—to lower the resistivity likewise lowers the transparency. Furthermore, obtaining a satisfactory p+ layer at room temperature is difficult, as the upper limit of ionized carrier concentration is about 1 to $2 \times 10^{18}$cm$^{-3}$ at room temperature. As another disadvantage, the manufacturing technique will always be limited by the solid solubility of aluminum in silicon carbide.

Furthermore, LPE processes tend to facilitate the addition of n layers to p layers rather than vice versa because nitrogen gas can be introduced into the melt to add the dopant to the resulting epitaxial layer. A typical acceptor atom such as aluminum, however, is much more difficult to add to an epitaxial layer in LPE processes than is nitrogen. Accordingly, adding a p-type epitaxial layer to an n-type substrate is generally regarded as an unavailable process for forming diodes in silicon carbide. The reason is that instead of being able to introduce nitrogen gas into the melt to form the n-type layer, aluminum would have to be introduced as the last step, a process which is much more difficult, if not impossible, compared to adding nitrogen gas.

Finally, LPE processes for SiC comprise growth of epitaxial layers from a silicon melt in a graphite crucible at temperature in excess of 1600° C. Typically, impurities in the graphite crucible, which is physically consumed during epitaxial growth as part of the LPE process, become incorporated in the growing epitaxial layers; i.e. the p+ and n compensated layers. Many of these impurities have energy levels that fall within the SiC band gap and their presence leads additional undesired recombination events, resulting photons, and a consequent broadening of the emission peak. Therefore, using this growth technique, sharp, narrow bandwidth emission has not been demonstrated to be practical. For example, the aforementioned commercially available LED specifies a full width at half maximum (FWHM) bandwidth (also referred to as "spectral half-width") of 90-95 nanometers.

Accordingly, there exists the need for improved techniques for manufacturing, and improved resulting structures of, blue LED's formed in silicon carbide that can operate on the basis of injection of electrons as well as holes, that can therefore achieve higher dopant concentrations, higher purity films, more transparent substrates, better current-voltage characteristics, lower resistance, and that can be used to produce diodes which emit in the 475-480 nanometer range, in the 455-460 nanometer range, and in the 424-428 nanometer range, all with narrow bandwidths.

SUMMARY OF THE INVENTION

Accordingly, the present invention comprises a light emitting diode formed in silicon carbide and that emits visible light having a wavelength of between about 475-480 nanometers, or between about 455-460 nanometers, or between about 424-428 nanometers. The diode comprises a substrate of alpha silicon carbide having a first conductivity type and a first epitaxial layer of alpha silicon carbide upon the substrate having the same conductivity type as the substrate. A second epitaxial layer of alpha silicon carbide is upon the first epitaxial layer, has the opposite conductivity type from the first layer, and forms a p-n junction with the first epitaxial layer. In preferred embodiments, the first and second epitaxial layers have carrier concentrations sufficiently different from one another so that the amount of hole current and electron current that flow across the junction under biased conditions are different from one another and so that the majority of recombination events take place in the desired epitaxial layer.

The foregoing and other objects, advantages and features of the invention, and the manner in which the same are accomplished, will become more readily apparent upon consideration of the following detailed description of the invention taking in conjunction with the accompanying drawings, which illustrate preferred and exemplary embodiments, and wherein:

DESCRIPTION OF THE DRAWINGS

FIGS. 5 through 8 are schematic diagrams of diodes according to the present invention that emit at a peak wavelength of between about 475 and 480 nanometers;

FIG. 11 is a plot of current versus voltage characteristics for a diode according to the present invention; and FIG. 12 is a cross-sectional view of a mesa LED structure according to the present invention.

DETAILED DESCRIPTION OF THE PREFERRED EMBODIMENTS

Figure 1:
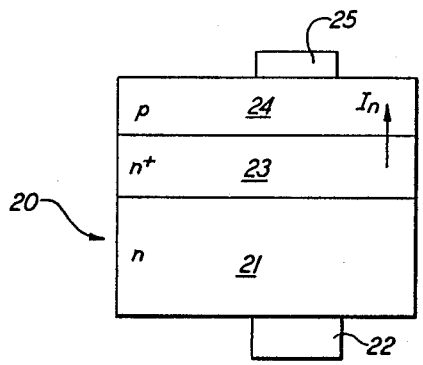
FIGS. 1 and 2 are schematic diagrams of diodes according to the present invention that emit at a peak wavelength of between about 455 and 460 nanometers.

FIG. 1 shows a light emitting diode generally designated at 20 formed in silicon carbide according to the present invention and which emits visible light having a wavelength of between about 455-460 nanometers. The diode comprises an n-type substrate of alpha silicon carbide 21. An ohmic contact 22 provides electrical contact to the substrate 21. In particular embodiments of the invention, the ohmic contact 22 to the n-type substrate 21, or to n-type epitaxial layers as described hereinafter, may comprise a metal such as nickel. Similarly, the ohmic contacts to be described hereinafter to both p-type substrates and p-type epitaxial layers may comprise a metal such as aluminum.

In the diode 20, a substantially uncompensated n-type epitaxial layer 23 is upon the n-type substrate 21 and has a carrier concentration greater than the carrier concentration of the n-type substrate. As used herein, the phrase "substantially uncompensated" refers to a crystalline epitaxial structure in which some minor amount of opposite conductivity type dopant may be present, but not in an amount which gives the crystal those characteristics which those familiar with such structures generally refer to as "compensated," and which will be more fully described hereinafter. As mentioned earlier herein, the greater donor concentration in the epitaxial layer 23 is often symbolized by a designation such as "n+". A substantially uncompensated p-type epitaxial layer 24 of alpha-type silicon carbide is upon the n+-type epitaxial layer 23 and forms a p-n junction with the n+-type layer. The p-type epitaxial layer 24 has a carrier concentration less than the carrier concentration of the n+-type epitaxial layer 23.

As used herein when referring to the populations of the respective epitaxial layers of the diodes described herein, the designations "greater than" or "less than" refer to a difference in carrier concentration between the respective epitaxial layers that is large enough to cause either the flow of hole current or the flow of electron current to clearly predominate across the junction and so as to likewise cause the majority of recombination events which take place as current flows across the junction to take place in the desired epitaxial layer. The flow of current through the diode can be thought of as a flow of electrons from the n side of the junction to the p side, a current which is called electron current and represented by the designation "$I_n$". The current can also be thought of as the flow of holes from p material across the junction into the n-type material, a current which is designated "$I_p$".

As further known to those familiar with such devices and their operations, $I_n$ and $I_p$ do not have to be the same and are usually different. In FIG. 1, the predominate flow is of electron current and is designated by the arrow $I_n$.

An ohmic contact 25 is made to the substantially uncompensated p-type epitaxial layer 24 and the resulting diode produces a peak emission at a wavelength of between about 455–460 nanometers with a spectral half-width at peak wavelength of no more than about 50 nanometers.

In a preferred embodiment, the light emitting diode of FIG. 1 is produced by growing the respective epitaxial layers by the chemical vapor deposition technique referred to earlier in co-pending application Ser. No. 113,573. This application is incorporated entirely herein and the chemical vapor deposition techniques disclosed therein will be referred to hereinafter and in the claims for purposes of definition and clarity as "Davis-type" chemical vapor deposition.

Because of the purity and crystalline quality of the epitaxial layers and resulting diodes that result from Davis-type chemical vapor deposition, light emitting diodes such as the one illustrated in FIG. 1 can, in preferred embodiments produce a peak emission at the wavelength of between about 455–460 nanometers with a spectral half-width at peak wavelength of no more than about 25 nanometers. In the diode 20, the n-type substrate 21 and n-type epitaxial layer 23 can include nitrogen as the donor carrier and the p-type epitaxial layer can include aluminum as an acceptor carrier.

Furthermore, and as is known to those familiar with the crystalline nature and structure of silicon carbide, the alpha-type silicon carbide used in the substrate and the epitaxial layers can have a polytype selected from the group consisting of the 6H, 4H, and 15R polytypes.

As will be recognized by those familiar with the operation of such diodes, because the p-type layer 24 is doped with aluminum, when a predominating flow of electrons travels from the n+ epitaxial layer 23 into the p-type epitaxial layer 24, the predominate recombination event will take place between the conduction band of silicon carbide and the dopant band of aluminum. The energy represented by this transmission corresponds to the 455–460 nanometer photon and the characteristic blue light. As stated earlier, there will be a corresponding nonpredominating flow of holes from the p-type epitaxial layer 24 into the n+ epitaxial layer 23 which will likewise result in some recombination events such as those between the conduction and the valance band of silicon carbide, which corresponds to a 424–428 nanometer emission, but because the electron current predominates, the 455–460 nanometer events and emission of light will likewise predominate.

As set forth above, the carrier concentration of the n+ layer 23 is maintained sufficiently greater than the carrier concentration of the p-type epitaxial layer 24 to cause the electron current to predominate. Typically, the carrier concentration of such a "greater than" layer will be at least an order of magnitude greater than the adjacent layer into which the carriers are being injected. In a typical diode, the substrate would have a donor level in the range of about $5 \times 10^{17}$ to $1 \times 10^{18}$ carriers per cubic centimeter (often abbreviated $cm^{-3}$), while in an n+ epitaxial layer the donor population would be on the order of between about $5 \times 10^{18}$ and $2 \times 10^{19}$ $cm^{-3}$. In such a situation, the p-type epitaxial layer will have a hole population of approximately $2 \times 10^{17}$ to $2 \times 10^{18}$ $cm^{-3}$. A typical size for such a diode is a substrate thickness on the order of about 300 microns, with epitaxial layers on the order of one or two microns as may be desired to accomplish various characteristics of the diode.

Figure 2:
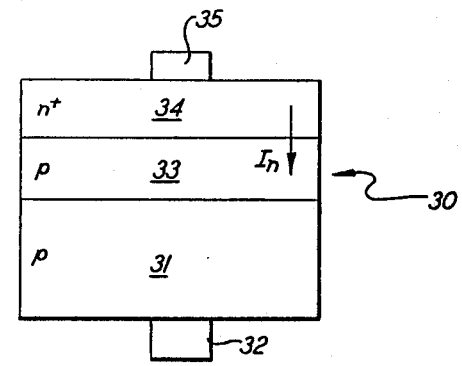

FIG. 2 is a schematic diagram of another light emitting diode 30 formed in silicon carbide on a p-type substrate 31 of alpha-type silicon carbide. An ohmic contact 32 is provided to the substrate 31 and a substantially uncompensated p-type epitaxial layer 33 is upon the p-type substrate 31. A substantially uncompensated n-type epitaxial layer 34 of alpha silicon carbide is upon the p-type epitaxial layer 33 and forms a p-n junction with the p-type epitaxial layer 33. The n-type epitaxial layer 34 has a carrier concentration greater than the carrier concentration of the p-type epitaxial layer 33, and an ohmic contact 35 is formed to the n-type epitaxial layer. The diode 30 likewise produces a peak emission at the wavelength of between about 455–460 nanometers with a spectral half-width at peak wavelength of no more than about 50 nanometers.

In a preferred embodiment, the diode 30 is likewise formed by respectively growing the epitaxial layers 33 and 34 by Davis-type chemical vapor deposition which in preferred embodiments results in a diode that produces the peak emission at the wavelength of between about 455–460 nanometers with a spectral half-width at peak wavelength on no more than about 25 nanometers.

As in the other embodiments, the n-type epitaxial layer can include nitrogen as a donor carrier and the p-type epitaxial layer and the p-type substrate may both include aluminum as an acceptor carrier. The diode may likewise be formed from alpha-type silicon carbide selected from the group consisting of the 6H, 4H and 15R polytypes.

As indicated by the arrow $I_n$ in FIG. 2, the predominate flow of carriers is the flow of electrons and takes place from the n+ layer 34 into the p layer 33 resulting in the identical transition set forth with respect to FIG. 1.

Figure 3:
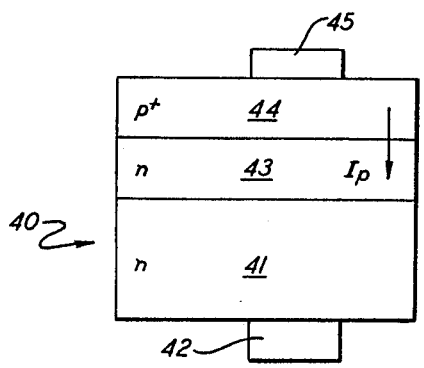
FIGS. 3 and 4 are schematic diagrams of diodes according to the present invention that emit at a peak wavelength of between about 424 and 428 nanometers.
Figure 4:
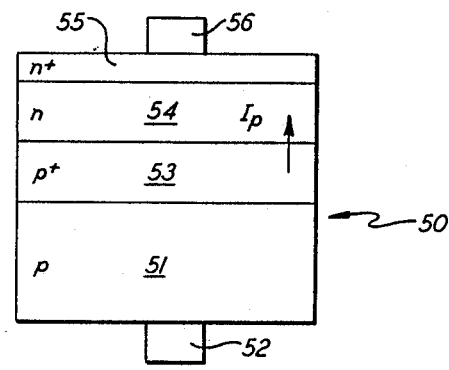

FIGS. 3 and 4 illustrate diodes according to the present invention which will emit light having a peak emission of between about 424-428 nanometers. Light of this wavelength represents the full band gap transition between the conduction band and the valance band of silicon carbide, rather than a transition between one band of silicon carbide and one dopant band, or between two dopant bands. As will be seen with respect to the structure of FIGS. 3 and 4, this transition is accomplished by forming the diode with such a structure so that the predominant current flow is the flow of holes. As is known to those familiar with silicon carbide and its characteristics, the full band gap recombination event is characteristically preferred in silicon carbide over the transition which would otherwise take place between the n-type (usually nitrogen) dopant level in the n-type material and the valance band. FIG. 3 illustrates a first type of light emitting diode which will emit the characteristic 424 nanometer photon. The diode is generally designated at 40 and includes an n-type substrate 41 of alpha silicon carbide and an ohmic contact 42 to the n-type substrate 41. A substantially uncompensated n-type epitaxial layer 43 of alpha silicon carbide is upon the n-type substrate 41 and a substantially uncompensated p-type epitaxial layer 44 of alpha silicon carbide is upon the n-type epitaxial layer 43 and forms a p-n junction with the n-type epitaxial layer. The p-type epitaxial layer 44 has a carrier concentration greater than the carrier concentration of the n-type epitaxial layer 43, with both the n-type layer 43 and the p-type layer 44 being formed by Davis-type chemical vapor deposition. An ohmic contact 45 is made to the p-type epitaxial layer 44. As described earlier, because the p-type epitaxial layer 44 predominates in carrier concentration, the predominate flow of current will be hole current from the p-type epitaxial layer to the n-type epitaxial layer 43 as indicated by the arrow $I_p$. The diode thus produces a peak emission of between about 424-428 nanometers with a spectral half-width at peak wavelength of no greater than about 50 nanometers. In preferred embodiments, the spectral half-width at peak wavelength is no greater than about 25 nanometers.

As in the earlier embodiments, the n-type substrate and the n-type epitaxial layer 41 and 43 respectively can include nitrogen as a donor carrier and the p-type epitaxial layer 44 may include aluminum as the acceptor carrier. The substrate 41 and the respective epitaxial layers 43 and 44 can have a polytype selected from the group consisting of 6H, 4H and 15R polytypes of silicon carbide, and as likewise in the earlier embodiments, the ohmic contact to the p-type epitaxial layer 44 can comprise aluminum, and the ohmic contact to the n-type substrate 41 can comprise nickel. As further set forth with respect to this and earlier embodiments, the n-type substrate 41 provides the advantage of a greater transparency at a lower resistivity than do the p-type substrates, even though the p-type substrates may be preferred under certain circumstances.

FIG. 4 shows another embodiment of a light emitting diode designated at 50 formed on a p-type substrate 51 of alpha silicon carbide. An ohmic contact 52 is made to the substrate 51 and a substantially uncompensated p-type epitaxial layer 53 is upon the p-type substrate 51 and has a carrier concentration greater than the carrier concentration of the p-type substrate 51. A first substantially uncompensated n-type epitaxial layer 54 of alpha silicon carbide is upon the p-type epitaxial layer 53 and has a carrier concentration less than the carrier concentration of the p-type epitaxial layer 53. A second substantially uncompensated n-type epitaxial layer 55 is upon the first n-type epitaxial layer 54 and has a carrier concentration greater than the carrier concentration of the first n-type epitaxial layer 54.

For the diodes illustrated in FIGS. 3 and 4, the p or n substrate would typically have a carrier concentration of between about $5 \times 10^{17}$ and $1 \times 10^{18}$ cm$^{-3}$, the p+ epitaxial layer would have a carrier concentration of between about 1 and $2 \times 10^{18}$ cm$^{-3}$, and the n epitaxial layer would have a carrier concentration of between about $1 \times 10^{16}$ and $1 \times 10^{17}$ cm$^{-3}$. As in the case of the diodes described with respect to FIGS. 1 and 2, a typical substrate will be on the order of 300 microns thick, with the epitaxial layers being on the order of 1 or 2 microns thick depending on the desired characteristics and design. It will be understood that these are typical values and that the diodes of the present invention are not limited to these specific values.

An ohmic contact 56 is made to the second n-type epitaxial layer 55. The more highly populated second n-type epitaxial layer 55 thus forms a conductive surface that moderates the current crowding that would otherwise occur about the contact 56 to the second n-type epitaxial layer 55. The resulting diode produces a peak emission of between about 424-428 nanometers with a spectral half-width at peak wavelength no greater than about 50 nanometers.

As indicated by the arrow $I_p$ in FIG. 4, the predominating current flow is the flow of holes from the p-type epitaxial layer 53 into the n-type epitaxial layer 54 which, as explained earlier, tends to preferably result in the full band gap transition between the conduction band and valance band of silicon carbide and the emission of the resulting 424-428 nanometer photon.

As in the earlier embodiments, the epitaxial layers 53 and 54 are respectively grown by Davis-type chemical vapor deposition and in such preferred embodiments, the spectral half-width at the peak wavelength is no greater than about 25 nanometers. Similarly to the other embodiments, the donor carrier can include nitrogen and the acceptor carrier can include aluminum. The polytype of the substrate and epitaxial layers can be selected from the group consisting of the 6H, 4H and 15R polytypes of alpha silicon carbide and the ohmic contacts can comprise nickel to the n-type epitaxial layer 55 and aluminum to the p-type substrate 51 respectively.

FIG. 5 shows another light emitting diode generally designated at 60 formed in silicon carbide according to the present invention and which emits visible light having a wavelength of between about 475-480 nanometers. The diode comprises an n-type substrate of alpha-type silicon carbide 61. An ohmic contact 62 provides electrical contact to the substrate 61. A substantially uncompensated n-type epitaxial layer 63 of alpha-type silicon carbide is formed upon the n-type substrate 61 and has a donor population greater than the donor population of the n-type substrate. A compensated p-type epitaxial layer 64 of alpha-type silicon carbide is formed upon the substantially uncompensated n-type epitaxial layer and forms a p-n junction with the n-type epitaxial layer 63. A substantially uncompensated p-type epitaxial layer 65 of alpha-type silicon carbide is formed upon the compensated p-type epitaxial layer and has an acceptor population greater than or equal to the acceptor population of the compensated p-type epitaxial layer 64. A conductive contact 66 to the substantially uncompensated p-type epitaxial layer completes the diode. The purpose of the p+-type uncompensated epitaxial layer 65 is to form a highly conductive surface that evens out the light emitted by the diode and avoids the current crowding problems observed in earlier diodes in silicon carbide. It will be understood, however, that in the absence of the p+ uncompensated epitaxial layer, a suitable diode can be formed by adding the contact 66 directly to the compensated p-type epitaxial layer 64.

As set forth previously, the term "compensated" (which some references call "overcompensated") refers to the use of both donor and acceptor type dopants in a doped portion of material which nevertheless maintains either a donor or an acceptor type characteristic. For example, in a compensated p-type layer, both p-type and n-type dopants (acceptor and donor atoms respectively) are included, but with the number of p-type acceptor atoms being sufficiently greater than the number of n-type donor atoms to give the epitaxial layer p-type characteristics. In a similar manner, an n-type compensated material would carry both donor and acceptor atoms as intended dopants, but with the number of donor type atoms sufficiently exceeding the number of acceptor type atoms to give the entire epitaxial layer n-type characteristics.

As further set forth earlier herein, the flow of current through the diode can be thought of as a flow of electrons from the n side of the junction to the p side, a current which is called electron current and represented by the designation "$I_n$". The current can also be identified as the flow of holes from p material into the n-type material across the junction, a current which is designated "$I_p$". For a device which emits blue light utilizing electron injection into a p-type compensated layer, most of the current under forward bias should preferably be electron current ($I_n$) which results in injection of a large population of electrons into the compensated p side of the junction, which in turn results in more recombination events and a greater quantity of light emitted. Conversely, for an n-type compensated layer, most of the current under forward bias should preferably be hole current (Ip) which results in the injection of a large population of holes into the compensated n side of the junction. In order to accomplish this, and as set forth in the discussion above, an n+ or p+ layer is used to form an n+-p or p+-n junction, respectively; i.e. a junction in which more carriers (holes or electrons) are present on the side of the junction from which carriers are injected (the "+" side)

For the diodes discussed with respect to FIGS. 5-8, typical carrier concentrations (cm$^{-3}$) include $5 \times 10^{17}$ to $1 \times 10^{18}$ for the respective n or p substrates, $5 \times 10^{18}$ to $2 \times 10^{19}$ for the n+ epitaxial layers, $5 \times 10^{16}$ to $5 \times 10^{17}$ for the compensated n-type epitaxial layers, $1-2 \times 10^{18}$ for the p+ epitaxial layers, and $1 \times 10^{16}$ to $5 \times 10^{17}$; for the compensated p-type layer. As set forth with respect to the other diodes discussed herein, typical substrates can be on the order of 300 microns thick, while typical epitaxial layers will be on the order of 1 or 2 microns thick. As stated previously, these are typical values, and the diodes of the present invention are not limited to these particular values or ranges of values.

As discussed above with respect to the prior art, devices have heretofore used only p+-n (compensated) junctions in order to get the 475-480 nanometer recombination. From a practical standpoint, the process of liquid phase epitaxial growth (LPE) of SiC generally requires the use of a p-type substrate and limits design and fabrication to p+-n structures. More importantly, LPE results in a relatively unpure and defective compensated n layer which generates an emission with a very broad bandwidth.

In contrast, the process of Davis-type chemical vapor deposition provides flexibility to utilize both n or p type substrates and to produce LED's with narrow-band emission at three various wavelengths.

The advantages of the diode of the invention as just discussed include the following: (1) a higher injection current due to the ability to obtain a higher donor population in the n+ layer; (2) a highly transparent, almost colorless substrate with low resistivity; (3) better current voltage characteristics; (4) high purity in the epitaxial layers grown by Davis-type CVD; and (5) narrow bandwidth emissions, which result from the high purity of the epitaxial layers. One can also take advantage of the latter three features and utilize hole injection into an n compensated layer as shown in FIG. 6. Likewise one can obtain improved device characteristics by taking advantage of (1) and (4) (see FIG. 7) or (4) alone (FIG. 8).

In FIG. 6, the diode is designated at 70, the n-type substrate at 71, the ohmic contact to the substrate at 72, the compensated n-type epitaxial layer at 73, the p+ epitaxial layer at 74, and the ohmic contact to the p+ layer at 75. As indicated by the arrow $I_p$, the diode of FIG. 6 operates by injection of holes from the p+ layer 74 into the compensated n-type epitaxial layer 73.

In FIG. 7, the diode is designated at 80, the p-type substrate at 81, the ohmic contact to the substrate at 82, the compensated p-type epitaxial layer at 83, the n+ epitaxial layer at 84, and the ohmic contact to the n+ layer at 85. In this embodiment, electron current designated by the arrow $I_n$ flows from the n+ epitaxial layer 84 into the compensated p-type epitaxial layer 83.

In FIG. 8, the diode is designated at 90, the p-type substrate at 91, the ohmic contact to the substrate at 92, the p+ epitaxial layer at 93, the compensated n-type epitaxial layer at 94, a substantially uncompensated n+ epitaxial layer at 95, and the ohmic contact to the n+ layer at 96. As noted with respect to the embodiment of FIG. 4, the n+ epitaxial layer 95 provides a highly conductive surface that helps prevent current crowding that would otherwise occur about the contact 96. As indicated by the arrow $I_p$, this embodiment operates by the injection of hole current from the p+ layer 93 into the compensated n-type epitaxial layer 94.

Figure 9:
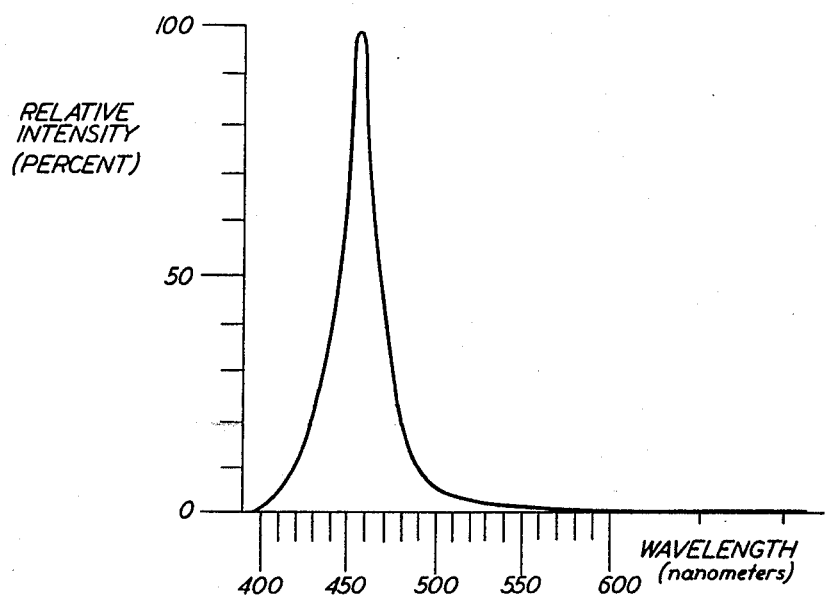
FIGS. 9 and 10 are emission spectra for diodes according to the present invention.
Figure 10:
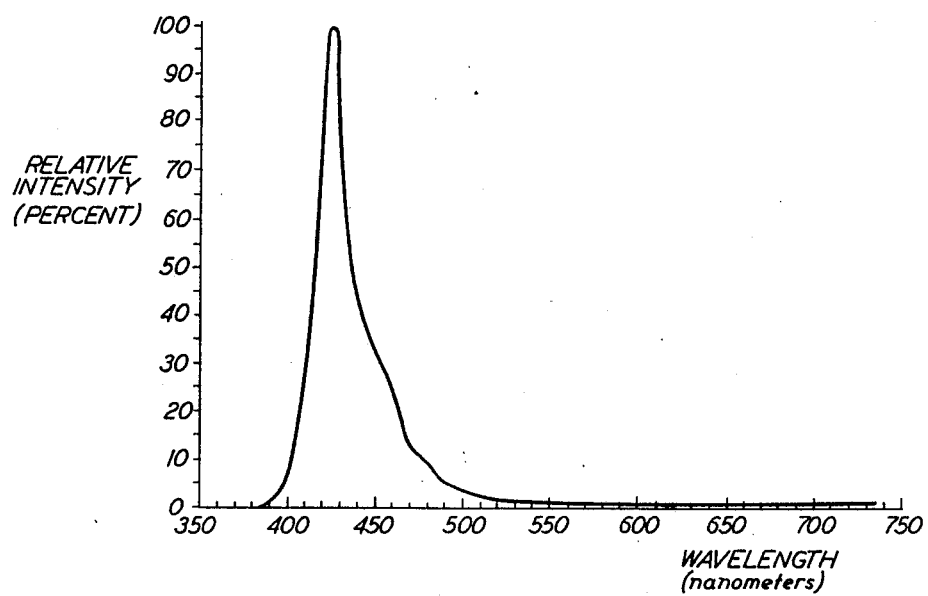

FIGS. 9 and 10, represent the spectrum of 455 nanometers and 424 nanometers LED's respectively, formed according to the present invention and plotted as units of intensity (relative) against wavelength in nanometers. Wavelength data for the diodes represented in FIGS. 9 and 10 are summarized in Table I.

TABLE I

| FIG. | Peak Wavelength | Spectral Halfwidth |
|---|---|---|
| 9 | 456 nm | 26 nm |
| 10 | 425 nm | 23 nm |

As a brief summary of the technique set forth in the co-pending application Ser. No. 113, 573, the epitaxial layer of the diodes of the present invention are grown by chemical vapor deposition of alpha silicon carbide on a lapped and polished, off-axis substrate of alpha silicon carbide. In forming an uncompensated n-type layer, a stream of ethylene (C₂H₄) and silane (SiH₄) gases are introduced into the CVD system. A nitrogen containing gas is introduced at the chosen concentration and in accordance with the parameters set forth in the incorporated reference, an n-type epitaxial layer of alpha silicon carbide is formed.

All of the gases are then turned off so that the system is clear, following which ethylene and silane are reintroduced to begin the process of forming the p-type layer. Aluminum is added by bubbling hydrogen gas (H₂) through trimethyl aluminum (TMA) to form an aluminum containing gas. The result is a p-type epitaxial layer upon the n-type epitaxial layer both of which have been formed in an essentially continuous process.

In order to form a compensated epitaxial layer, the flow of nitrogen in the previous process is either maintained or slightly reduced while aluminum is added as just described, but without stopping the flow of nitrogen.

In order to form the p+ epitaxial layer upon the compensated layer, the previous process can be continued but with nitrogen turned off at the end so that only aluminum is added to the last epitaxial layer formed.

FIG. 11 shows the current-voltage characteristics of a diode according to the present invention, and in particular shows a forward current of 100 milliamps at a forward voltage of 4.4 volts, and a reverse leakage current of less than 1 microamp at −5 volts.

Finally, FIG. 12 illustrates a cross section of a mesa configuration which provides a suitable structure for the light emitting diodes of the present invention. The substrate is indicated at 101, the respective epitaxial layers at 102 and 103, and the ohmic contacts at 104 and 105 to the substrate and epitaxial layer 103 respectively. In the mesa configuration, a passivation layer 106, for example of silicon dioxide, may be added to protect the p-n junction. Following the growth of the epitaxial layers by Davis-type chemical vapor deposition, the layers and substrate may be appropriately etched, and the ohmic contacts and passivation layer added using otherwise conventional techniques such a photolithography. A suitable etching technique is set forth in the copending application of Palmour, "Dry Etching of Silicon Carbide," Ser. No. 116,467, filed Nov. 3, 1987, which is assigned to the assignee of the present invention and which is likewise incorporated entirely herein by reference. As known to those familiar with device manufacture, the mesa configuration delineates the p-n junction and isolates junctions from one another when several or many are formed on a common substrate. Accordingly, when a number of such diodes are fabricated at one time adjacent one another, a usual manufacturing scenario, separating the individual diodes, usually by sawing the substrate, will not harm the edges or the junction, or otherwise affect the desired crystal structure.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which I claim is:

1. A light emitting diode formed in silicon carbide that emits light in the blue to violet portion of the visible spectrum and comprising:
   an n-type substrate of alpha-type silicon carbide;
   an ohmic contact to said substrate;
   a substantially uncompensated n-type monocrystalline epitaxial layer alpha-type silicon carbide upon said n-type substrate;
   a p-type monocrystalline epitaxial layer of alpha-type silicon carbide upon said n-type epitaxial layer and forming a p-n junction with said n-type layer, said p-type epitaxial layer having a carrier concentration less than the carrier concentration of said uncompensated n-type epitaxial layer; and
   an ohmic contact to said p-type epitaxial layer, said diode producing a peak emission at a wavelength of between about 455 and 460 nanometers with a spectral half width at peak wavelength of no more than about 50 nanometers.

2. A light emitting diode according to claim 1 wherein said n-type epitaxial layer has a carrier concentration greater than the carrier concentration of said n-type substrate.

3. A light emitting diode according to claim 1 that produces a peak emission at a wavelength of between about 455 and 460 nanometers with a spectral half width at peak wavelength of no more than about 25 nanometers.

4. A light emitting diode according to claim 1 wherein said n-type substrate and said n-type epitaxial layer include nitrogen as a donor carrier.

5. A light emitting diode according to claim 1 wherein said p-type epitaxial layer includes aluminum as an acceptor carrier.

6. A light emitting diode according to claim 1 wherein the alpha-type silicon carbide has a polytype selected from the group consisting of: 6H, 4H, and 15R.

7. A light emitting diode according to claim 1 wherein said ohmic contact to said n-type substrate comprises nickel and said ohmic contact to said p-type epitaxial layer comprises aluminum.

8. A light emitting diode according to claim 1 wherein said monocrystalline n-type epitaxial layer comprises a single polytype and said p-type monocrystalline epitaxial layer comprises a single polytype.

9. A light emitting diode formed in silicon carbide that emits light in the blue to violet portion of the visible spectrum and comprising:
   a p-type substrate of alpha-type silicon carbide;
   an ohmic contact to said substrate;
   a substantially uncompensated p-type monocrystalline epitaxial layer of alpha-type silicon carbide upon said p-type substrate;
   a substantially uncompensated n-type monocrystalline epitaxial layer of alpha-type silicon carbide upon said p-type epitaxial layer and forming a p-n junction with said p-type layer, said n-type epitaxial layer having a carrier concentration greater than the carrier concentration of said p-type epitaxial layer; and
   an ohmic contact to said n-type epitaxial layer, said diode producing a peak emission at a wavelength of between about 455 and 460 nanometers with a spectral half width at peak wavelength of no more than about 50 nanometers.

10. A light emitting diode according to claim 9 that produces a peak emission at a wavelength of between about 455 and 460 nanometers with a spectral half width at peak wavelength of no more than about 25 nanometers.

11. A light emitting diode according to claim 9 wherein said n-type epitaxial layer includes nitrogen as a donor carrier.

12. A light emitting diode according to claim 9 wherein said p-type substrate and said p-type epitaxial layer include aluminum as an acceptor carrier.

13. A light emitting diode according to claim 9 wherein the alpha-type silicon carbide has a polytype selected from the group consisting of: 6H, 4H, and 15R.

14. A light emitting diode according to claim 9 wherein said ohmic contact to said substantially uncompensated n-type epitaxial layer comprises nickel and said ohmic contact to said p-type substrate comprises aluminum.

15. A light emitting diode according to claim 9 wherein said monocrystalline p-type epitaxial layer comprises a single polytype and said n-type monocrystalline epitaxial layer comprises a single polytype.

16. A light emitting diode formed in silicon carbide that emits light in the blue to violet portion of the visible spectrum and comprising:
- an n-type substrate of alpha-type silicon carbide;
- an ohmic contact to said n-type substrate;
- a substantially uncompensated n-type monocrystalline epitaxial layer of alpha-type silicon carbide upon said n-type substrate;
- a substantially uncompensated p-type monocrystalline epitaxial layer of alpha-type silicon carbide upon said n-type epitaxial layer and forming a p-n junction with said n-type epitaxial layer, said p-type epitaxial layer having a carrier concentration greater than the carrier concentration of said n-type epitaxial layer; and
- an ohmic contact to said uncompensated p-type epitaxial layer, said diode producing a peak emission of between about 424 and 428 nanometers with a spectral half width at peak wavelengths of no greater than about 50 nanometers.

17. A light emitting diode according to claim 16 that produces a peak emission of between about 424 and 428 nanometers with a spectral half width at peak wavelength of no greater than about 25 nanometers.

18. A light emitting diode according to claim 16 wherein said n-type substrate and said n-type epitaxial layer include nitrogen as a donor carrier.

19. A light emitting diode according to claim 16 wherein said p-type epitaxial layer includes aluminum as an acceptor carrier.

20. A light emitting diode according to claim 16 wherein the alpha-type silicon carbide has a polytype selected from the group consisting of: 6H, 4H, and 15R.

21. A light emitting diode according to claim 16 wherein said ohmic contact to said substantially uncompensated p-type epitaxial layer comprises aluminum and said ohmic contact to said n-type substrate comprises nickel.

22. A light emitting diode according to claim 16 wherein said monocrystalline n-type epitaxial layer comprises a single polytype and said p-type monocrystalline epitaxial layer comprises a single polytype.

23. A light emitting diode formed in silicon carbide that emits light in the blue to violet portion of the visible spectrum and comprising:
- a p-type substrate of alpha silicon carbide;
- an ohmic contact to said p-type substrate;
- a substantially uncompensated p-type monocrystalline epitaxial layer of silicon carbide upon said p-type substrate;
- a first substantially uncompensated n-type monocrystalline epitaxial layer of alpha silicon carbide upon said p-type epitaxial layer, and having a carrier concentration less than the carrier concentration of said p-type epitaxial layer;
- a second substantially uncompensated n-type monocrystalline epitaxial layer of silicon carbide upon said first n-type epitaxial layer, and having a carrier concentration greater than the carrier concentration of said first n-type epitaxial layer; and
- an ohmic contact to said second n-type epitaxial layer, wherein said second n-type epitaxial layer forms a conductive surface that moderates the current crowding that would otherwise occur about said contact to said second n-type epitaxial layer, said diode producing a peak emission of between about 424 and 428 nanometers with a spectral half width at peak wavelength of no greater than about 50 nanometers.

24. A light emitting diode according to claim 23 wherein said substantially uncompensated p-type epitaxial layer has a carrier concentration greater than the carrier concentration of said p-type substrate.

25. A light emitting diode according to claim 23 that produces a peak emission of between about 424 and 428 nanometers with a spectral half width at peak wavelength of no greater than about 25 nanometers.

26. A light emitting diode according to claim 23 wherein said n-type epitaxial layers include nitrogen as a donor carrier.

27. A light emitting diode according to claim 23 wherein said p-type substrate and said p-type epitaxial layer include aluminum as an acceptor carrier.

28. A light emitting diode according to claim 23 wherein the alpha-type silicon carbide has a polytype selected from the group consisting of: 6H, 4H, and 15R.

29. A light emitting diode according to claim 23 wherein said ohmic contact to said second n-type epitaxial layer comprises nickel and said ohmic contact to said p-type substrate comprises aluminum.

30. A light emitting diode according to claim 23 wherein said monocrystalline p-type epitaxial layer comprises a single polytype and said n-type monocrystalline epitaxial layer comprises a single polytype.

31. A light emitting diode formed in silicon carbide that emits light in the blue to violet portion of the visible spectrum and comprising:
- an n-type substrate of alpha-type silicon carbide;
- an ohmic contact to said n-type substrate;
- a substantially uncompensated n-type monocrystalline epitaxial layer of alpha-type silicon carbide upon said n-type substrate;
- a compensated p-type monocrystalline epitaxial layer of alpha-type silicon carbide upon said uncompensated n-type epitaxial layer and forming a p-n junction with said n-type epitaxial layer; and
- an ohmic contact to said compensated p-type epitaxial layer.

32. A light emitting diode according to claim 31 wherein said uncompensated n-type epitaxial layer has a carrier concentration greater than the carrier concentration of said n-type substrate.

33. A light emitting diode according to claim 31 and further comprising an uncompensated p-type epitaxial layer of alpha-type silicon carbide upon said compensated p-type epitaxial layer, said uncompensated p-type epitaxial layer having a carrier concentration greater than the carrier concentration of said compensated p-type epitaxial layer, and wherein said uncompensated p-type epitaxial layer forms a conductive surface that moderates the current crowding that would otherwise occur about said contact to said p-type epitaxial layer.

34. A light emitting diode according to claim 31 characterized by the emission of light having a peak wavelength of between about 475 and 480 nanometers with a spectral half width at peak wavelength of no greater than about 50 nanometers.

35. A light emitting diode according to claim 31 characterized by the emission of light having a peak wavelength of between about 475 and 480 nanometers with a spectral half width at peak wavelength of no greater than about 25 nanometers.

36. A light emitting diode according to claim 31 wherein said n-type substrate and said n-type epitaxial layer include nitrogen as a donor carrier.

37. A light emitting diode according to claim 31 wherein said compensated p-type epitaxial layer includes aluminum as an acceptor carrier and nitrogen as a donor carrier.

38. A light emitting diode according to claim 31 wherein the alpha-type silicon carbide has a polytype selected from the group consisting of: 6H, 4H, and 15R.

39. A light emitting diode according to claim 31 wherein said ohmic contact to said n-type substrate comprises nickel and said ohmic contact to said compensated p-type epitaxial layer comprises aluminum.

40. A light emitting diode according to claim 31 wherein said monocrystalline n-type epitaxial layer comprises a single polytype and said p-type monocrystalline epitaxial layer comprises a single polytype.

41. A light emitting diode formed in silicon carbide that emits light in the blue to violet portion of the visible spectrum and comprising:
an n-type substrate of alpha silicon carbide;
a compensated n-type monocrystalline epitaxial layer of alpha silicon carbide upon said substrate; and
a substantially uncompensated p-type monocrystalline epitaxial layer upon said n-type epitaxial layer, said p-type epitaxial layer having a carrier concentration greater than the carrier concentration of said n-type epitaxial layer; and in which said diode produces a peak emission at a wavelength of between about 475 and 480 nanometers with a spectral half width at peak wavelength of no more than about 50 nanometers.

42. A light emitting diode according to claim 41 in which said diode produces a peak emission at a wavelength of between about 475 and 480 nanometers with a spectral half width at peak wavelength of no more than about 25 nanometers.

43. A light emitting diode according to claim 41 wherein said n-type substrate and said compensated n-type epitaxial layer include nitrogen as a donor carrier.

44. A light emitting diode according to claim 43 wherein said compensated n-type epitaxial layer further includes aluminum as an acceptor carrier.

45. A light emitting diode according to claim 41 wherein said substantially uncompensated p-type epitaxial layer includes aluminum as an acceptor carrier.

46. A light emitting diode according to claim 41 wherein the alpha-type silicon carbide has a polytype selected from the group consisting of: 6H, 4H, and 15R.

47. A light emitting diode according to claim 41 further comprising an ohmic contact to said n-type substrate and an ohmic contact to said substantially uncompensated p-type epitaxial layer.

48. A light emitting diode according to claim 41 wherein said monocrystalline n-type epitaxial layer comprises a single polytype and sad p-type monocrystalline epitaxial layer comprises a single polytype.

49. A light emitting emitting diode formed in silicon carbide that emits light in the blue to violet portion of the visible spectrum and comprising:
a p-type substrate of alpha silicon carbide;
a compensated p-type monocrystalline epitaxial layer of alpha silicon carbide upon said susbtrate; and
a substantially uncompensated n-type monocrystalline epitaxial layer upon said compensated p-type epitaxial payer and forming a p-n junction with said compensated p-type layer, said n-type epitaxial layer having a carrier concentration greater than the carrier concentration of said compensated p-type epitaxial layer.

50. A light emitting diode according to claim 49 that produces a peak emission at a wavelength of between about 475 and 480 nanometers with a spectral half width of no more than about 50 nanometers.

51. A light emitting diode according to claim 49 that produces a peak emission at a wavelength of between about 475 and 480 nanometers with a spectral half width of no more than about 25 nanometers.

52. A light emitting diode according to claim 49 wherein said n-type epitaxial layer includes nitrogen as a donor carrier.

53. A light emitting diode according to claim 49 wherein said p-type substrate and said compensated p-type epitaxial layer include aluminum as an acceptor carrier.

54. A light emitting diode according to claim 53 wherein said compensated p-type epitaxial layer further includes nitrogen as a donor carrier.

55. A light emitting diode according to claim 49 wherein the alpha-type silicon carbide has a polytype selected from the group consisting of: 6H, 4H, and 15R.

56. A light emitting diode according to claim 49 further comprising an ohmic contact to said p-type substrate and an ohmic contact to said substantially uncompensated n-type epitaxial layer.

57. A light emitting diode according to claim 49 wherein said monocrystalline p-type epitaxial layer comprises a single polytype and said n-type monocrystalline epitaxial layer comprises a single polytype.

58. A light emitting diode formed in silicon carbide that emits light in the blue to violet portion of the visible spectrum and comprising:
a p-type substrate formed of alpha silicon carbide;
an ohmic contact to said substrate;
a substantially uncompensated p-type monocrystalline epitaxial layer formed of alpha silicon carbide upon said substrate;
a compensated n-type monocrystalline epitaxial layer upon said p-type epitaxial layer, said n-type epitaxial layer having a carrier concentration less than the carrier concentration of said p-type epitaxial layer; and
a substantially uncompensated n-type monocrystalline epitaxial layer upon said compensated n-type epitaxial layer and having a carrier concentration greater than the carrier concentration of said compensated n-type epitaxial layer; and
an ohmic contact to said uncompensated n-type epitaxial layer, and wherein said n-type epitaxial layer forms a conductive surface that moderates the current crowding that would otherwise occur about said contact to said n-type epitaxial layer, and in which said diode produces a peak emission at a wavelength of between about 475 and 480 nanometers with a spectral half width at peak wavelength of no more than about 50 nanometers.

59. A light emitting diode according to claim 58 that produces a peak emission at a wavelength of between about 475 and 480 nanometers with a spectral half width at peak wavelength of no more than about 25 nanometers.

60. A light emitting diode according to claim 58 wherein said compensated n-type epitaxial layer and said substantially uncompensated n-type epitaxial layer include nitrogen as a donor carrier.

61. A light emitting diode according to claim 60 wherein said compensated n-type epitaxial layer further includes aluminum as an acceptor carrier.

62. A light emitting diode according to claim 58 wherein the alpha-type silicon carbide has a polytype selected from the group consisting of: 6H, 4H, and 15R.

63. A light emitting diode according to claim 58 wherein said ohmic contact to said substantially uncompensated n-type epitaxial layer comprises nickel and said ohmic contact to said p-type substrate comprises aluminum.

64. A light emitting diode according to claim 58 wherein said monocrystalline p-type epitaxial layer comprises a single polytype and said n-type monocrystalline epitaxial layer comprises a single polytype.

* * * * *

UNITED STATES PATENT AND TRADEMARK OFFICE
CERTIFICATE OF CORRECTION

PATENT NO. : 4,918,497

DATED : April 17, 1990

INVENTOR(S) : John A. Edmond

It is certified that error appears in the above-identified patent and that said Letters Patent is hereby corrected as shown below:

Column 12, lines 15-16, "current voltage" should be --current-voltage--.

Column 18, line 3, "sad" should be --said--.

Column 18, line 13, "payer" should be --layer--.

Signed and Sealed this

Third Day of December, 1991

*Attest:*

HARRY F. MANBECK, JR.

*Attesting Officer*     *Commissioner of Patents and Trademarks*